(12) United States Patent
Takaike et al.

(10) Patent No.: US 8,884,795 B2
(45) Date of Patent: Nov. 11, 2014

(54) RECEPTION DEVICE AND RECEPTION METHOD

(71) Applicant: Sony Corporation, Tokyo (JP)

(72) Inventors: Yoshihisa Takaike, Tokyo (JP); Hideki Yokoshima, Kanagawa (JP); Yuya Kondo, Kanagawa (JP); Tomohiro Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/962,068

(22) Filed: Aug. 8, 2013

(65) Prior Publication Data

US 2014/0062749 A1    Mar. 6, 2014

(30) Foreign Application Priority Data

Aug. 28, 2012   (JP) .................................. 2012-187410

(51) Int. Cl.
| | | |
|---|---|---|
| H03M 1/00 | (2006.01) | |
| H03M 1/18 | (2006.01) | |
| H03M 1/12 | (2006.01) | |

(52) U.S. Cl.
CPC .............. *H03M 1/129* (2013.01); *H03M 1/186* (2013.01); *H03M 1/183* (2013.01)
USPC ................. 341/139; 360/31; 360/51; 360/53; 360/65; 455/73; 455/255; 455/296; 455/311; 375/345; 375/346; 341/130; 341/155

(58) Field of Classification Search
CPC ....................................................... H03M 1/186
USPC ............. 341/130–155; 375/345–346; 360/31, 360/51, 53, 65; 455/73, 255, 296, 311
See application file for complete search history.

(56) References Cited

U.S. PATENT DOCUMENTS

| | | | | |
|---|---|---|---|---|
| 5,555,272 | A * | 9/1996 | Balestro et al. ................ | 375/220 |
| 7,996,003 | B2 * | 8/2011 | Maeda et al. ................... | 455/423 |
| 8,193,961 | B2 * | 6/2012 | Bailey et al. ................... | 341/155 |
| 8,417,203 | B2 * | 4/2013 | Saito ........................... | 455/234.1 |
| 8,443,266 | B2 * | 5/2013 | Sakai ............................. | 714/776 |

FOREIGN PATENT DOCUMENTS

JP        2011-061660        3/2011

* cited by examiner

*Primary Examiner* — Lam T Mai
(74) *Attorney, Agent, or Firm* — Rader, Fishman & Grauer PLLC

(57) ABSTRACT

A reception device and corresponding method for maintaining a high dynamic range of an AD converter circuit and preventing excessive input to the AD converter circuit is disclosed. For example, a reception device includes a variable gain amplifier circuit that amplifies an input analog signal with a gain controlled by a predetermined control signal, an analog-to-digital converter circuit an overload detector circuit with the same frequency characteristic as the analog-to-digital converter circuit. The overload detector circuit outputs a signal according to a comparison between a level of a signal input to the analog-to-digital converter circuit and a predetermined threshold. The signal that lowers the gain of the variable gain amplifier circuit more greatly is selected out of the signal from the overload detector circuit and another signal, and the gain of the variable gain amplifier circuit is controlled on the basis of the selected signal.

7 Claims, 8 Drawing Sheets

RECEPTION DEVICE AND RECEPTION METHOD

TECHNICAL FIELD

The present disclosure relates to a reception device and a reception method suitable when applied to a tuner or the like including an analog-to-digital converter circuit having a frequency characteristic.

BACKGROUND ART

At present, television broadcasting in Japan is digital broadcasting. In order to demodulate digital broadcasting to obtain high definition signals, digitization of demodulator circuits in television receivers is also underway.

FIG. 1 is a functional block diagram showing an example of a reception device used for a tuner of a television receiver.

The reception device 10 shown in FIG. 1 includes an antenna 1, an RF filter 2, a variable gain amplifier circuit 3, an RF filter 4, a frequency converter circuit 5, an analog-to-digital converter circuit (referred to as ADC in FIG. 1) 6, an overload detector circuit 7, an integrator 8, and a selector circuit 9. The reception device 10 is an automatic gain control system that controls the gain of the variable gain amplifier circuit 3 on the basis of amplitude information of a signal output from the analog-to-digital converter circuit (hereinafter referred to as an AD converter circuit) 6.

The RF filters 2, 4 are used when a signal in an RF (radio frequency) band is received by using the antenna 1 for the purpose of suppressing interference wave signals that lead to degradation in the quality of the received signal. Specifically, the RF filters 2, 4 have functions of a band-pass filter configured to allow a signal in a desired frequency band to pass therethrough and block signals in the other frequency bands. The variable gain amplifier circuit 3 is an amplifier circuit for increasing the level (amplitude) of a received signal, and the gain thereof varies linearly or log-linearly with control voltage applied thereto.

The frequency converter circuit 5 is used for down-converting a broadcast wave signal modulated onto a carrier wave to a frequency band that can be processed by the AD converter circuit 6. A mixer, for example, is applied as the frequency converter circuit 5. The mixer receives a local oscillator signal (LO signal) input from a PLL (phase locked loop) that is a known local oscillator, multiplies the LO signal and the received signal together, and outputs an intermediate frequency signal (hereinafter also referred to as "IF").

The AD converter circuit 6 is used for converting the received signal from an analog signal to a digital signal. A ΔΣ (delta-sigma) AD converter circuit having a frequency circuit 6 or the like is used as the AD converter circuit 6.

The overload detector circuit 7 is a circuit for detecting an interference wave signal that degrades the quality of the received signal. Since the level of the interference wave signal to be detected is sufficiently higher than that of a desired wave signal, detection is not performed on the desired wave signal.

FIG. 2 shows an example structure of the overload detector circuit of the related art.

The overload detector circuit 7 shown in FIG. 2 includes a comparator circuit 11 and a peak hold circuit 12. The comparator circuit 11 is a circuit configured to compare the amplitude of the input signal with an output value (threshold) of a reference signal set in advance and output the comparison result. The output signal has one bit or multiple bits. Since the peak portion of a modulated wave signal has a waveform close to that of an impulse signal, the output of the comparator circuit 11 cannot be integrated by using only an integrator with a large time constant. Accordingly, the peak hold circuit 12 is placed upstream of the integrator 8 so as to hold the peak value of the signal and enable integration of the output of the comparator circuit 11.

The description refers back to the reception device 10 in FIG. 1. The integrator 8 is a circuit for integrating the one-bit or multi-bit signal output from the overload detector circuit 7.

The selector circuit 9 is a circuit for selecting a control signal for an automatic gain control loop output from a demodulator circuit or a control signal for an overload loop from the overload detector circuit 7. The selector circuit 9 is set so that the automatic gain control loop is normally selected and a loop for lowering the gain of the variable gain amplifier circuit 3 is selected when the overload detector circuit 7 operates according to an interference wave signal. In this manner, the selector circuit 9 switches from the automatic gain control loop as necessary according to the configuration or selects a maximum value or a minimum value of an input signal (voltage).

In a typical automatic gain control system, the level of the desired wave signal input to the AD converter circuit 6 is properly controlled by the automatic gain control loop from the demodulator circuit. If an interference wave signal exists, however, the automatic gain control loop using a control signal from the modulator circuit cannot perform control taking the interference wave into account. When an interference wave signal that is particularly greater than the desired wave signal exists, excessive input to the AD converter circuit 6 is therefore a problem in addition to signal distortion. If excessive input to the AD converter circuit 6 occurs, the information of the signal may be lost and oscillation may be generated by a ΔΣ AD converter circuit or the like. Excessive input to the AD converter circuit 6 should therefore be prevented.

FIG. 3 is a graph showing a frequency characteristic (broken line) of a ΔΣ AD converter circuit and a spectrum of a signal input to the ΔΣ AD converter circuit when an interference wave signal exists.

If the frequency band of the interference wave signal is greatly separated from the frequency band of the desired wave signal, the level of the interference wave signal (interference wave signal A) is sufficiently suppressed by the RF filters 2, 4. If the frequency band of the interference wave signal is close thereto, the suppression by the RF filters 2, 4 is small due to the characteristics thereof, and the interference wave signal is input substantially without any change to the AD converter circuit 6. In order to avoid the above, it is necessary to detect the level of the interference wave signal by the overload detector circuit 7, and control the gain of the variable gain amplifier circuit 3 on the basis of the detection information to lower the level of the interference wave signal to an appropriate level. In this process, the selector circuit 9 selects a control signal that lowers the gain more greatly than the other from the control signal of the automatic gain control loop from the modulator circuit and the control signal of the overload loop from the overload detector circuit 7.

For example, a radio reception device for realizing an AGC function without requiring any anti-aliasing filter having a sharp cut-off characteristic is proposed (refer, for example, to PTL 1).

CITATION LIST

Patent Literature

[PTL 1]
PTL 1: JP2011-61660A (FIG. 1)

SUMMARY

Technical Problem

With the structure as described above, however, the AD converter circuit with the frequency characteristic as that of the ΔΣ AD converter circuit is disadvantageous in that the dynamic range cannot be used effectively. The reasons therefor will be described below.

FIG. 4 is an explanatory graph showing an example of setting a threshold for the overload detector circuit 7 considering the frequency characteristic of the AD converter circuit 6.

The AD converter circuit 6 itself with the frequency characteristic has a gain (ΔGain) when the frequency becomes higher, for example. The signal level of the interference wave signal B in FIG. 3 increases owing to the frequency characteristic of the AD converter circuit 6. Accordingly, the threshold for detection needs to be lower by the gain in order to prevent excessive input when an interference wave signal (interference wave signal B) exists in the frequency band (see FIG. 4). A broken line in FIG. 4 represents an optimum threshold in the frequency band in which the frequency characteristic of the AD converter circuit 6 is flat. A solid line represents an actual threshold considering the frequency characteristic of the AD converter circuit 6.

With such a threshold considering the frequency characteristic of the AD converter circuit 6, the overload detector circuit 7 detects a lower signal level even when the frequency band of the interference wave signal (interference wave signal C) is closer to the desired wave signal, that is, even in the frequency band in which the frequency characteristic of the AD converter circuit 6 is flat. In this case, the problem of excessive input to the AD converter circuit 6 is overcome but an overload is detected and control to lower the gain of the variable gain amplifier circuit 3 is performed. As a result of lowering the gain of the variable gain amplifier circuit 3, the C/N ratio (carrier to noise ratio) as a system is degraded as compared to the characteristic with the threshold set according to the flat frequency characteristic of the AD converter circuit 6. In other word, when an interference wave signal exists in the frequency band in which the frequency characteristic of the AD converter circuit 6 is flat, the dynamic range of the AD converter circuit 6 is not used effectively. This means degradation in the resistance of the tuner system to interference waves.

An example of solution in the related art is a method of greatly suppressing the interference wave signals themselves by placing a filter with a sharp frequency characteristic at the input to the AD converter circuit. With this technique, however, an increase in the cost and in the current consumption due to an increase in the circuit size cannot be avoided. Furthermore, there is a disadvantage that the advantages of using the AD converter circuit having a high dynamic range such as a ΔΣ AD converter circuit are lost.

PTL 1 does not mention maintaining a high dynamic range of the ADC (7) and preventing excessive input to the ADC (7) due to interference wave signals.

In view of the aforementioned circumstances, a technique for maintaining a high dynamic range of an AD converter circuit and preventing excessive input to the AD converter circuit has been desired.

Solution to Problem

A reception device according to an aspect of the present disclosure includes: a variable gain amplifier circuit configured to amplify an input analog signal with a gain controlled by a predetermined control signal; and an analog-to-digital converter circuit having a predetermined frequency characteristic and configured to convert the analog signal subjected to gain control output from the variable gain amplifier circuit into a digital signal. The reception device further includes: an overload detector circuit having the same frequency characteristic as that of the analog-to-digital converter circuit and configured to output a signal according to a result of comparison between a level of a signal input to the analog-to-digital converter circuit and a predetermined threshold. Then, a signal that lowers the gain of the variable gain amplifier circuit more greatly is selected out of the signal output from the overload detector circuit and another signal, and the gain of the variable gain amplifier circuit is controlled on the basis of the selected signal.

According to an aspect of the present disclosure, an overload detector circuit having the same frequency characteristic as that of an analog-to-digital converter circuit is connected in parallel with the analog-to-digital converter circuit. As a result, it is possible to set a threshold according to the frequency characteristic of the analog-to-digital converter circuit and to use the dynamic range of the analog-to-digital converter circuit without any change.

Advantageous Effects of Invention

According to at least one embodiment of the present disclosure, it is possible to maintain a high dynamic range of an analog-to-digital converter circuit with a frequency characteristic and prevent excessive input to the analog-to-digital converter circuit.

DESCRIPTION OF EMBODIMENTS

Figure 1:
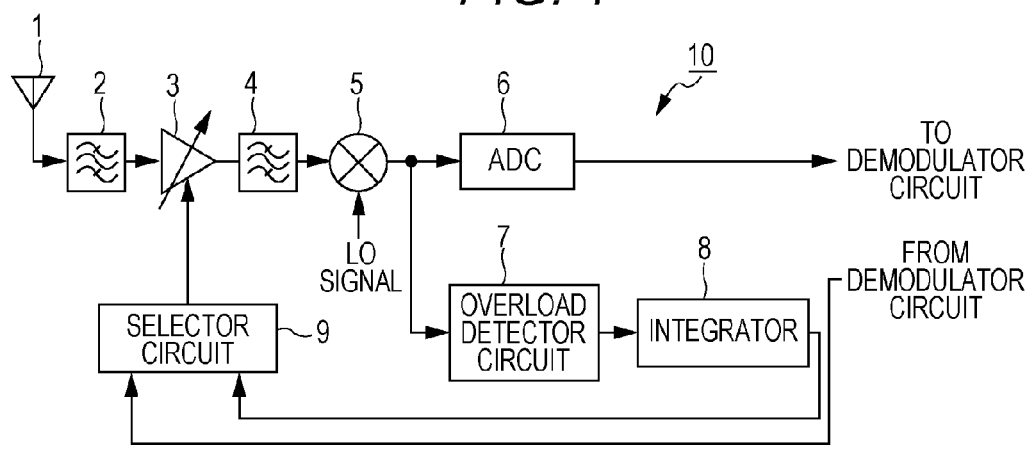
FIG. 1 is a functional block diagram showing an example of a reception device used for a tuner of a television receiver.

Examples of modes (hereinafter referred to as embodiments) for carrying out the present technology will be described below. In the present specification and drawings, components having substantially same functions or structures will be designated by the same reference numerals and redundant description thereof will not be repeated. The description will be made in the following order.
1. First Embodiment (overload detector circuit: an example in which a filter circuit having the same frequency characteristic as an AD converter circuit before a comparator circuit)
2. Second Embodiment (overload detector circuit: an example in which a signal on a path with a filter and a signal on a path without any filter are added and then compared with a threshold)
3. Third Embodiment (overload detector circuit: an example in which a signal on a path with a filter and a signal on a path without any filter are compared with a threshold and the logical OR operation of the outputs is implemented)
4. Others (modified examples)

1. First Embodiment

Figure 5:
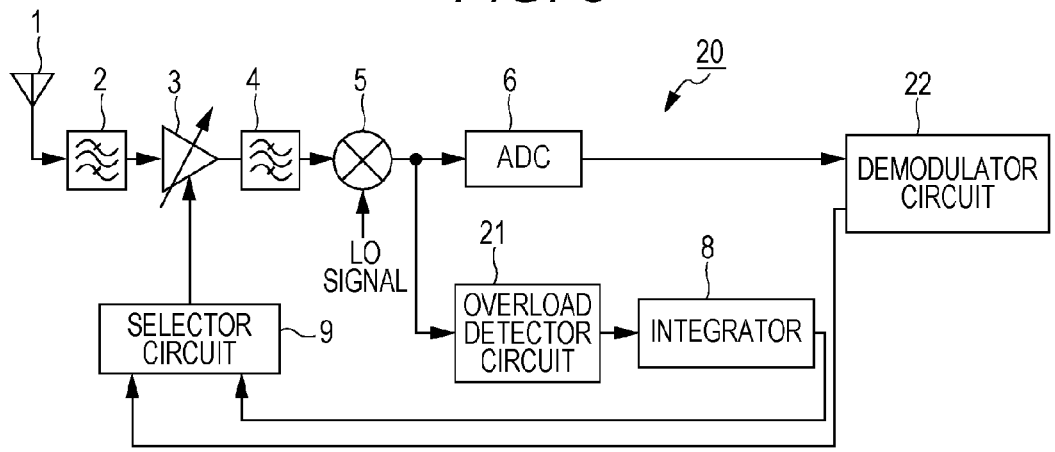
FIG. 5 is a functional block diagram showing an example of a reception device of a tuner of a television receiver in which an overload detector circuit according to a first embodiment of the present disclosure is used.

FIG. 5 is a functional block diagram showing an example of a reception device of a tuner of a television receiver in which an overload detector circuit according to a first embodiment of the present disclosure is used. In FIG. 5, parts corresponding to those of FIG. 1 are designated by the same reference numerals. Since the structure of the reception device 20 according to this example other than an overload detector circuit 21 is the same as that of the reception device 10 in FIG. 1, the description thereof will not be repeated. Note that a demodulator circuit 22 configured to output a signal for controlling the gain of the variable gain amplifier circuit 3 according to amplitude information of a signal output from the AD converter circuit 6 is shown in FIG. 5.

Figure 2:
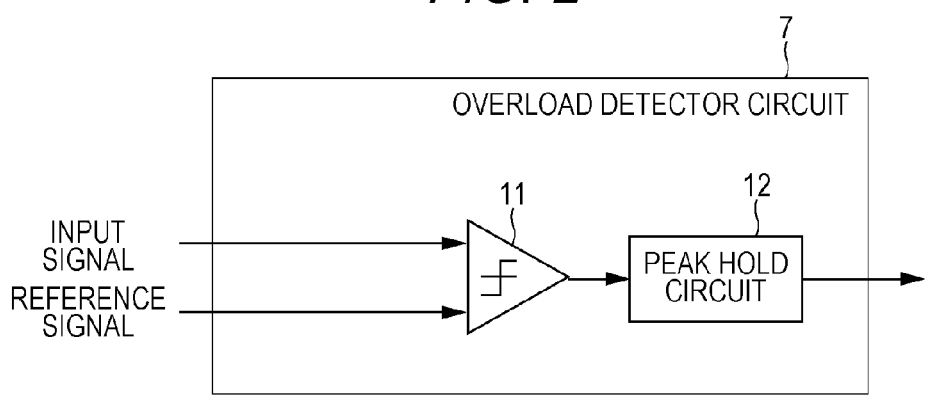
FIG. 2 shows an example structure of an overload detector circuit of the related art.
Figure 6:
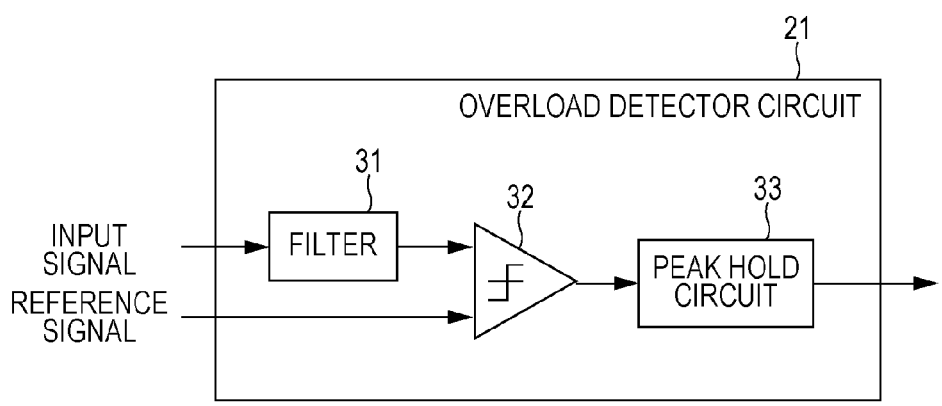
FIG. 6 is a functional block diagram showing an example structure of the overload detector circuit showing in FIG. 5.

FIG. 6 is a functional block diagram showing an example structure of the overload detector circuit 21 of FIG. 5. The overload detector circuit 21 shown in FIG. 6 includes a filter circuit 31, a comparator circuit 32, and a peak hold circuit 33. The comparator circuit 32 and the peak hold circuit 33 have the same functions as those of the comparator circuit 11 and the peak hold circuit 12 in FIG. 2. The comparator circuit 32 not only has a simple function of outputting a comparison result but may also be configured to generate a $\Delta\Sigma$ output, that is, an oversampled output, so as to output a low-noise signal.

In the present disclosure, the filter circuit 31 is inserted upstream of the comparator circuit 32 of the overload detector circuit 21. Specifically, the overload detector circuit 21 having the filter circuit 31 with the same frequency characteristic as the AD converter circuit 6 is connected in parallel with the AD converter circuit 6. The filter circuit 31 has the same frequency characteristic as the AD converter circuit 6. Thus, the filter circuit 31 has a high-pass frequency characteristic when the gain of the AD converter circuit 6 is a high-pass (HPF) gain or has a low-pass frequency characteristic when the gain of the AD converter circuit 6 is a low-pass (LPF) gain, for example. With the filter circuit 31, the dynamic range can be effectively used in the AD converter circuit 6 having the frequency characteristic as that of the $\Delta\Sigma$ AD converter circuit. The reasons therefor will be described below.

Since the same signal waveform as a signal output from the AD converter circuit 6 is input to the comparator circuit 32 by the filter circuit 31 having the same frequency characteristic as the AD converter circuit 6, a threshold according to the frequency characteristic of the AD converter circuit 6 can be set. As an example, an optimum threshold in the frequency band in which the frequency characteristic of the AD converter circuit 6 (see FIG. 3) is flat is set in the comparator circuit 32. The optimum threshold is determined on the basis of excessive input to the AD converter circuit 6, the C/N ratio, the trade-off of signal distortion.

When an interference wave signal (interference wave signal C) exists in the frequency band, the overload detector circuit 7 naturally detects the interference wave signal with the optimum threshold. Even when an interference wave signal (interference wave signal B) exists in a frequency band in which the AD converter circuit 6 has a gain and in which the suppression by the RF filters 2, 4 is small, the level of the interference wave signal is corrected by an amount corresponding to the frequency characteristic of the AD converter circuit 6 by the filter circuit 31. Accordingly, detection can be conducted at an optimum level that does not cause excessive input. In other words, the dynamic range of the AD converter circuit 6 can be effectively used regardless of in which frequency band an interference wave signal exists, which improves the resistance of the system to interference waves.

Figure 7:
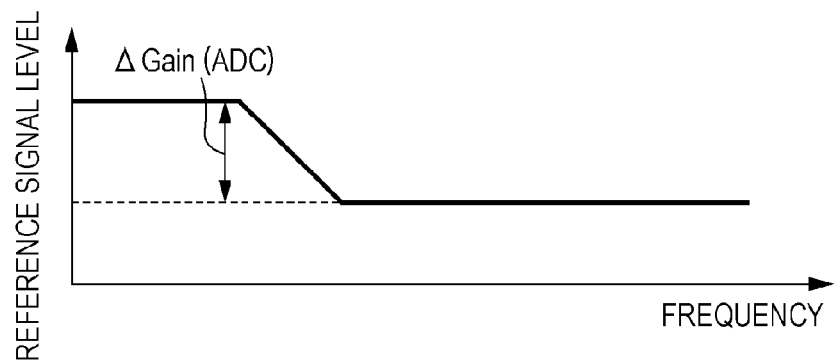
FIG. 7 is an explanatory graph showing an example of the frequency characteristic of a threshold in the overload detector circuit shown in FIG. 5.

This operation is equivalent to operation performed as if the threshold has a characteristic inverse to the frequency characteristic of the AD converter circuit 6 (see FIG. 3) when the entire overload detector circuit 7 is viewed as one block (see FIG. 7). A solid line in FIG. 7 represents the threshold of the overload detector circuit 21 considering the gain resulting from arranging the filter circuit 31 and substantially has a frequency characteristic.

The integrator 8 may be implemented by an analog circuit or a digital circuit.

Figure 8A:
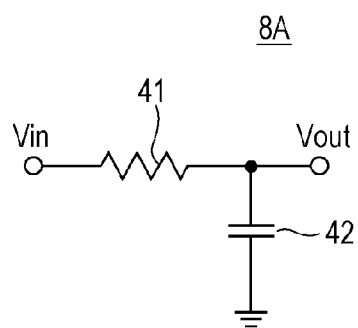
FIGS. 8A and 8B shows examples of an integrator implemented by an analog circuit.
Figure 8B:
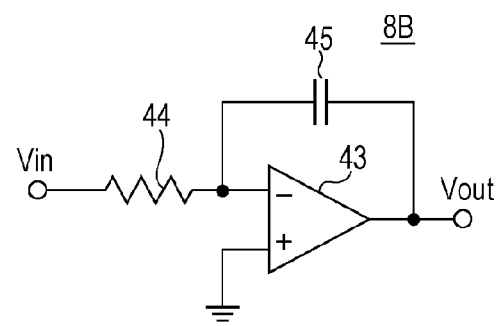

FIG. 8 shows examples of the integrator implemented by an analog circuit. The integrator 8A of FIG. 8A is an example including a resistor element 41 and a capacitative element 42, and the integrator 8B of FIG. 8B is an example including an operational amplifier 43, a resistor element 44, and a capacitative element 45. These integrators have time constants depending on the combination of a resistor element and a capacitative element. The time constant of a circuit is optimized according to the frequency of the signal to be received, that is, according to the television broadcasting technique, for example.

Figure 9:
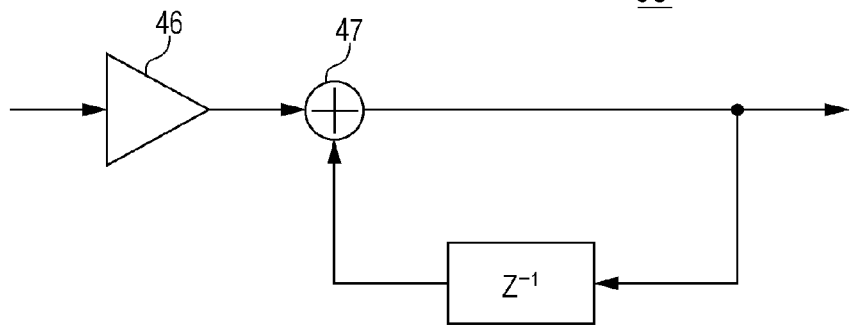
FIG. 9 shows an example of an integrator implemented by a digital circuit.

FIG. 9 shows an example of an integrator implemented by a digital circuit. The integrator 8C of this example includes an amplifier 46 having a predetermined amplification factor and an adder 47. A signal amplified by the amplifier 46 by the predetermined amplification factor is input to the adder 47. In addition, a signal output from the adder 47 and subjected to Z inverse transform is input to the adder 47 again. As a result, a current signal and a restored previous signal are added by the adder 47, and the result of addition is output therefrom.

As described above, in the reception device according to the first embodiment, a filter circuit having the same frequency characteristic as an AD converter circuit (such as a ΔΣ AD converter circuit) is provided in an overload detector circuit to which the same received signal as that input to the AD converter circuit is input. As a result, in the reception device including an AD converter circuit with a frequency characteristic and an automatic gain control system, the resistance to interference waves can be improved regardless of the frequency of the interference wave signals.

2. Second Embodiment

Figure 10:
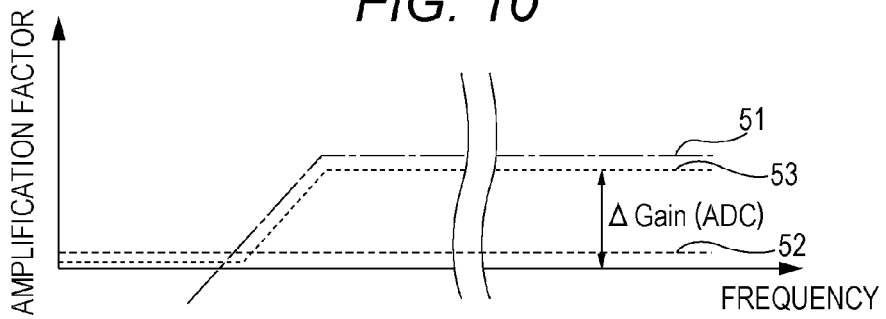
FIG. 10 is an explanatory graph showing an example of the frequency characteristic of an AD converter circuit and an example of the frequency characteristics of a path with a filter/a path without any filter in the overload detector circuit.

FIG. 10 is an explanatory graph showing an example of the frequency characteristic of the AD converter circuit 6 and an example of the frequency characteristics of a path with a filter/a path without any filter in the overload detector circuit 21.

Figure 3:
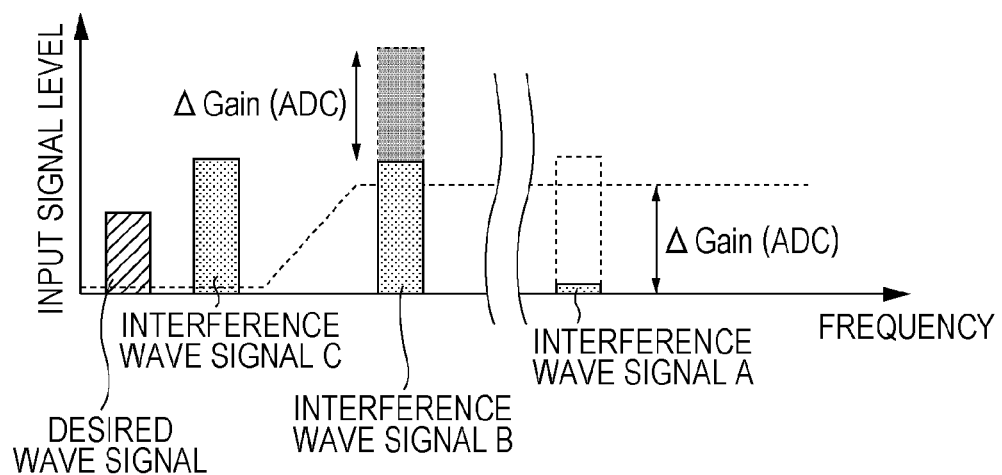
FIG. 3 is a graph showing a frequency characteristic (broken line) of a ΔΣ AD converter circuit and a spectrum of a signal input to the ΔΣ AD converter circuit when an interference wave signal exists.
Figure 4:
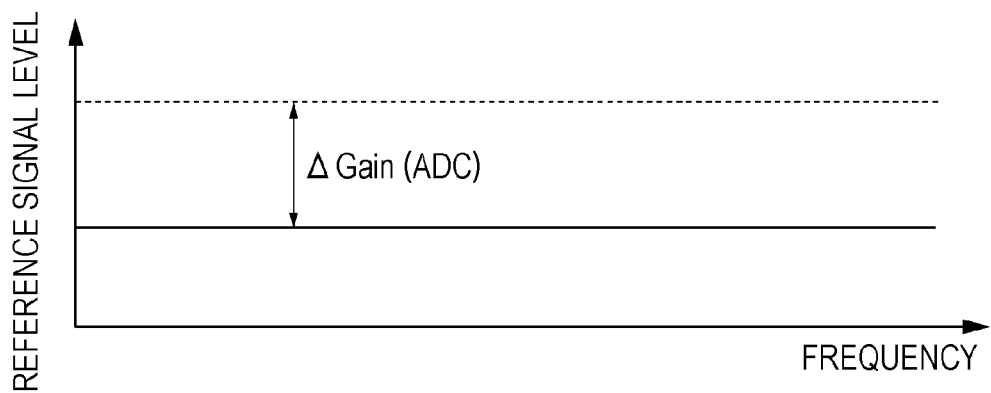
FIG. 4 is an explanatory graph showing an example of setting a threshold for a comparator circuit considering the frequency characteristic of an AD converter circuit.

It is less useful to realize the same frequency characteristic as that of the AD converter circuit 6 (see FIG. 5) shown by the broken line in FIG. 3 only by the filter circuit 31 because the design thereof is highly difficult and the filter circuit 31 is less flexible. It is therefore desirable to realize the same frequency characteristic 53 as that of the AD converter circuit 6 by combining two frequency characteristics, which are the frequency characteristic 51 of a path with a filter circuit and the frequency characteristic 52 of a path without any filter circuit as shown in FIG. 10. Examples of the circuits will be described with reference to FIGS. 11 to 13.

Figure 11:
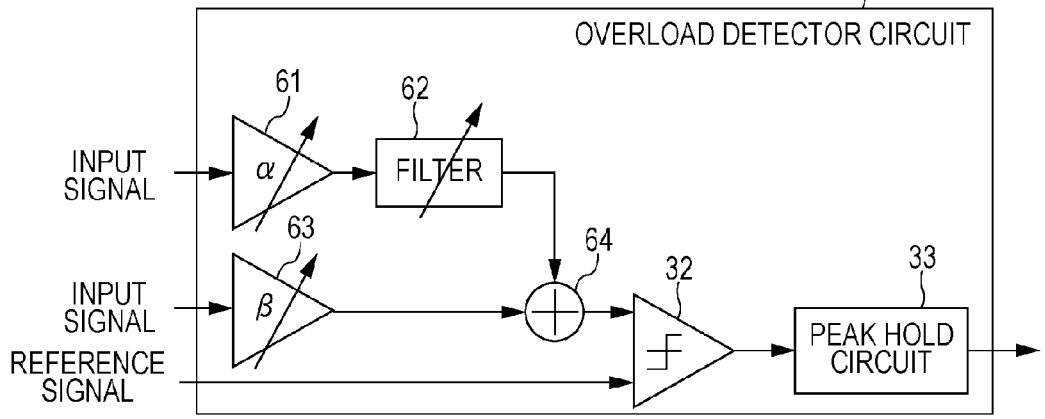
FIG. 11 is a functional block diagram showing an example structure of an overload detector circuit according to a second embodiment of the present disclosure.

FIG. 11 is a functional block diagram showing an example structure of an overload detector circuit according to a second embodiment of the present disclosure.

The overload detector circuit 21A shown in FIG. 11 includes a variable gain amplifier circuit 61, a band variable filter circuit 62, a variable gain amplifier circuit 63, an adder 64, a comparator circuit 32, and a peak hold circuit 33. The band variable filter circuit 62 can set a passband (the frequency characteristic 51, for example) corresponding to the passband according to the frequency characteristic (the frequency characteristic 53, for example) of the AD converter circuit 6. The adder 64 adds a signal input to and passing through the band variable filter circuit 62 and a signal that is not input to the band variable filter circuit 62, and outputs the addition result to the comparator circuit 32.

In the overload detector circuit 21A having the above-described structure, a signal on a path passing through the band variable filter circuit 62 (the variable gain amplifier circuit 61 and the band variable filter circuit 62) and a signal on a path not passing through the band variable filter circuit 62 (the variable gain amplifier circuit 63) are added by the adder 64. Then, in the comparator circuit 32, the signal resulting from the addition is compared with a reference signal (threshold) to detect overload. Since the gains of the two paths are respectively determined by the variable gain amplifier circuits 61, 63 thereon, the gains a, p of the variable gain amplifier circuits 61, 63 are determined so that the frequency characteristic equivalent to that of the AD converter circuit 6 is obtained.

Figure 12:
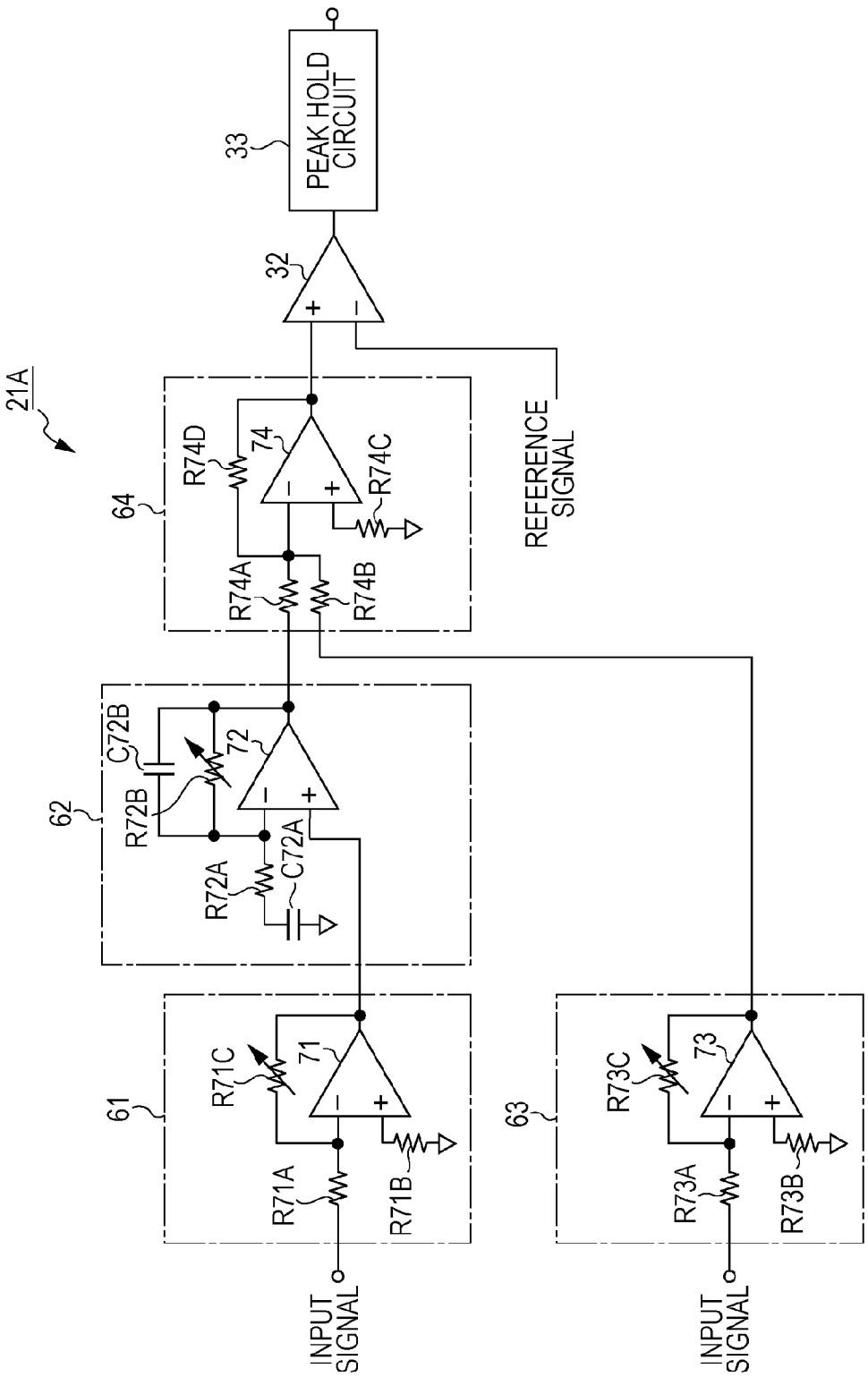
FIG. 12 is a circuit diagram showing an example in which the overload detector circuit shown in FIG. 11 is implemented by an analog circuit.

FIG. 12 shows an example in which the overload detector circuit 21A shown in FIG. 11 is implemented by an analog circuit. In FIG. 12, parts corresponding to those of FIG. 11 are designated by the same reference numerals and description thereof will not be repeated.

In the example of FIG. 12, the variable gain amplifier circuit 61 is implemented by an inverting amplifier circuit including an operational amplifier 71, resistor elements R71A, R71B, and a variable resistor element R71C. Similarly, the band variable filter circuit 62 is implemented by a non-inverting differentiator circuit including an operation amplifier 72, a resistor element R72A, a variable resistor element R72B, and capacitative elements C72A, C72B. The capacitative element C72B is for preventing divergence.

Furthermore, the variable gain amplifier circuit 63 is implemented by an inverting amplifier circuit including an operational amplifier 73, resistor elements R73A, R73B, and a variable resistor element R73C.

The adder 64 is implemented by an inverting adder circuit including an operational amplifier 74, and resistor elements R74A, R74B, R74C, R74D.

3. Third Embodiment

Figure 13:
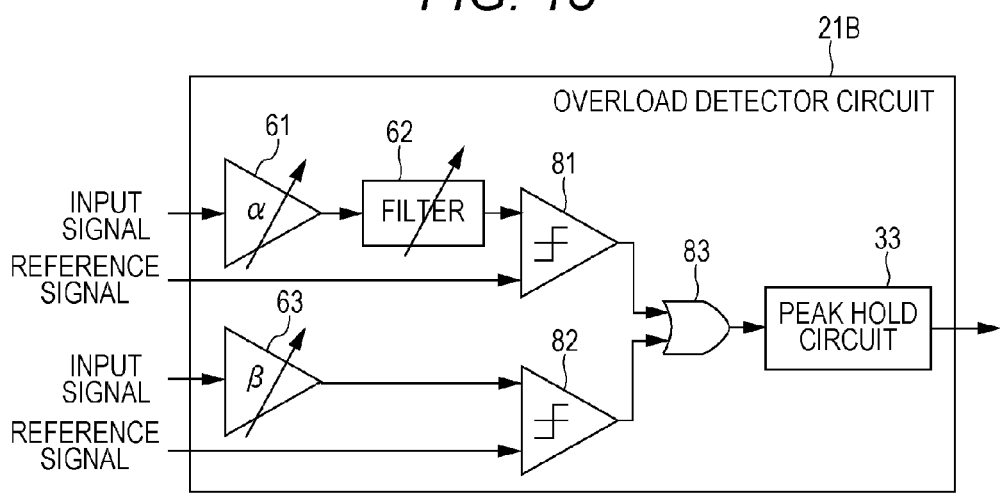
FIG. 13 is a functional block diagram showing an example structure of an overload detector circuit according to a third embodiment of the present disclosure.

FIG. 13 is a functional block diagram showing an example structure of an overload detector circuit according to a third embodiment of the present disclosure. In FIG. 13, parts corresponding to those of FIG. 11 are designated by the same reference numerals and description thereof will not be repeated.

The overload detector circuit 21B shown in FIG. 13 includes a variable gain amplifier circuit 61, a band variable filter circuit 62, a variable gain amplifier circuit 63, comparators 81, 82, an OR circuit (OR gate) 83, and a peak hold circuit 33. In the overload detector circuit 21B, signals on a path passing through the band variable filter circuit 62 and on a path not passing through the band variable filter circuit 62 are respectively compared with a threshold. Then, the OR circuit 83 obtains the logical sum of the outputs from the comparators 81, 82 on the respective paths to detect overload. The gains of the variable gain amplifier circuits 61, 63 may be the same as those determined in the case of FIG. 11.

With either of the example structures of FIGS. 11 and 13, an error between a design value and the frequency characteristic of an actual circuit can be corrected by making the gains of the variable gain amplifier circuits and the cut-off frequencies (or the passbands) of the band variable filter circuits variable. Therefore, in the second and third embodiments, effects that adjustment of the frequency characteristic is facilitated in the overload detector circuit and that realization of the same frequency characteristic as that of the AD converter circuit 6 can be made easier are produced in addition the effects in the first embodiments.

4. Others

Modified Example of Second Embodiment

Figure 14:
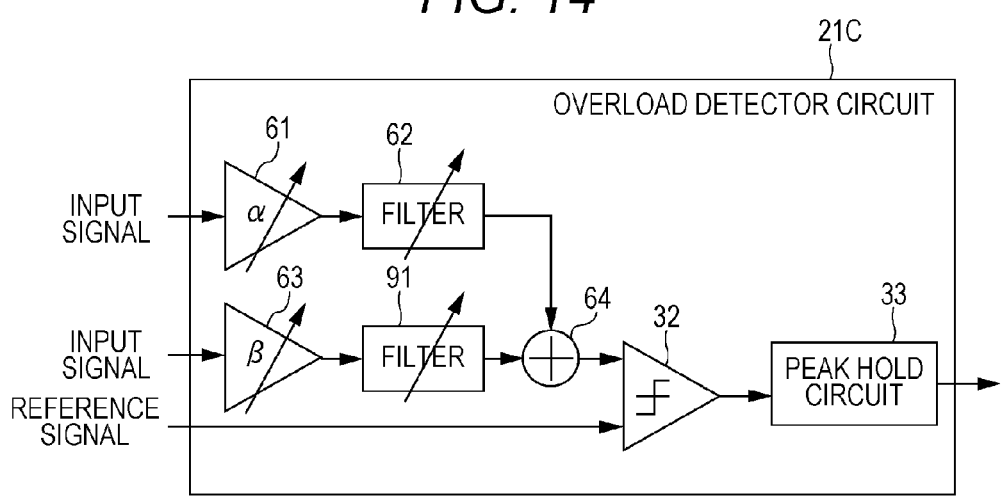
FIG. 14 is a functional block diagram showing an example structure of an overload detector circuit according to a modified example of the second embodiment of the present disclosure.

FIG. 14 is a functional block diagram showing an example structure of an overload detector circuit according to a modified example of the second embodiment (see FIG. 11) of the present disclosure. In FIG. 14, parts corresponding to those of FIG. 11 are designated by the same reference numerals and description thereof will not be repeated.

The overload detector circuit 21C shown in FIG. 14 further includes a band variable filter circuit 91 between the variable gain amplifier circuit 63 and the adder 64 of the overload detector circuit 21A. The band variable filter circuit 91 has a low-pass frequency characteristic in a frequency band lower than that of a part where the frequency characteristic 51 and the frequency characteristic 52 overlap (or a vicinity thereof) in FIG. 10, for example. The band variable filter circuit 91 then filters (allows or blocks) a signal subjected to gain control output from the variable gain amplifier circuit 63 on the basis of the frequency characteristic, and outputs the signal subjected to filtering to the adder 64.

This structure facilitates correction of an error between a design value and the frequency characteristic of an actual circuit even when the AD converter circuit 6 has a band rejection (or band-pass in different structures) frequency characteristic, for example. Furthermore, even with such a band variable filter circuit 91, the overload detector circuit 21C can have the same frequency characteristic as the frequency characteristic 53, that is, as that of the AD converter circuit 6 by adjusting the frequency characteristic of the band variable filter circuit 91 to have a cut off at a higher frequency than the frequency characteristic 51.

Modified Example of Third Embodiment

Figure 15:
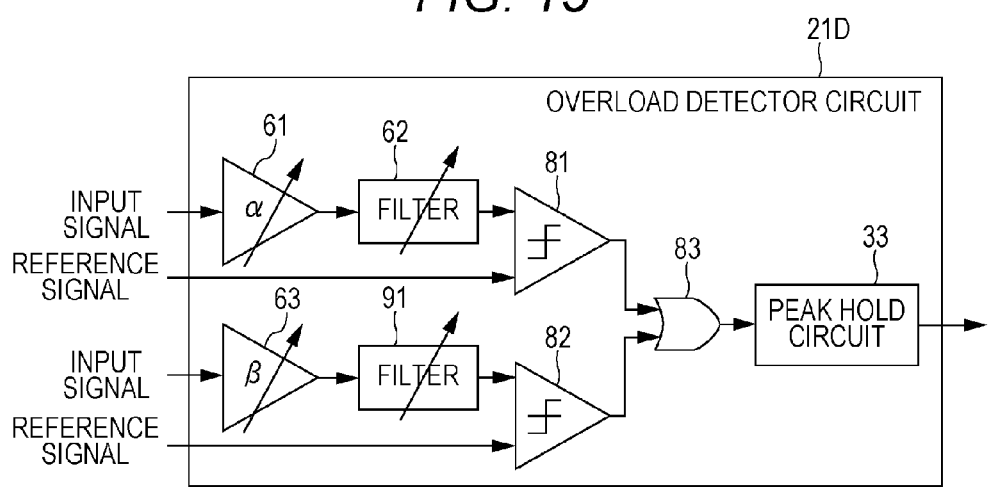
FIG. 15 is a functional block diagram showing an example structure of an overload detector circuit according to a modified example of the third embodiment of the present disclosure.

FIG. 15 is a functional block diagram showing an example structure of an overload detector circuit according to a modified example of the third embodiment (see FIG. 13) of the present disclosure. In FIG. 15, parts corresponding to those of FIG. 13 are designated by the same reference numerals and description thereof will not be repeated.

The overload detector circuit 21D shown in FIG. 15 further includes a band variable filter circuit 91 between the variable gain amplifier circuit 63 and the comparator circuit 82 of the overload detector circuit 21B. The band variable filter circuit 91 filters (allows or blocks) a signal subjected to gain control output from the variable gain amplifier circuit 63 on the basis of the frequency characteristic, and outputs the signal subjected to filtering to the comparator circuit 82.

This structure facilitates correction of an error between a design value and the frequency characteristic of an actual circuit even when the AD converter circuit 6 has a band rejection (or band-pass in different structures) frequency characteristic, for example. Furthermore, even with such a band variable filter circuit 91, the overload detector circuit 21D can have the same frequency characteristic as the frequency characteristic 53, that is, as that of the AD converter circuit 6 by adjusting the frequency characteristic of the band variable filter circuit 91 to have a cut off at a higher frequency than the frequency characteristic 51.

The reception device according to the first to third embodiments and the modified examples thereof described above has been described with reference to examples in which the reception device is used for a tuner of a television receiver, but the application thereof is not limited to television receivers. For example, the reception device can be applied to a radio receiver, and to any reception device that receives radio frequency signals.

Furthermore, while examples in which the overload detector circuit has the high-pass frequency characteristic 53 have been described in the first to third embodiments and the modified examples thereof described above, the overload detector circuit is not limited thereto and only needs to have the same frequency characteristic as that of the AD converter circuit 6.

The present disclosure can also have the following structures.

(1)

A reception device including: a variable gain amplifier circuit configured to amplify an input analog signal with a gain controlled by a predetermined control signal; an analog-to-digital converter circuit having a predetermined frequency characteristic and configured to convert the analog signal subjected to gain control output from the variable gain amplifier circuit into a digital signal;
an overload detector circuit having the same frequency characteristic as that of the analog-to-digital converter circuit and configured to output a signal according to a result of comparison between a level of a signal input to the analog-to-digital converter circuit and a predetermined threshold; and
a selector circuit configured to select a signal that lowers the gain of the variable gain amplifier circuit more greatly out of the signal output from the overload detector circuit and another signal, and output the control signal to control the gain of the variable gain amplifier circuit on the basis of the selected signal.

(2)

The reception device described in (1), wherein the overload detector circuit includes:
a filter circuit having the same frequency characteristic as that of the analog-to-digital converter circuit;
a comparator circuit configured to output a signal according to a result of comparison between a level of a signal output from the filter circuit and a predetermined threshold; and
a peak hold circuit configured to hold a peak value of the output signal.

(3)

The reception device described in (1) or (2), wherein the analog-to-digital converter circuit is a $\Delta\Sigma$ analog-to-digital converter circuit with a gain having a low-pass or high-pass frequency characteristic.

(4)

The reception device described in any one of (1) to (3), further including a frequency converter circuit provided between the variable gain amplifier circuit and the analog-to-digital converter circuit and configured to convert frequency of the analog signal subjected to the gain control to a desired frequency.

(5)

The reception device described in any one of (1) to (4), further including a demodulator circuit configured to output a control signal to the variable gain amplifier circuit on the basis of a digital signal output from the analog-to-digital converter circuit.

(6)

The reception device described in any one of (2) to (5), further including as the filter circuit:
a band variable filter circuit capable of setting a passband corresponding to a passband in the frequency characteristic of the analog-to-digital converter circuit; and
an adder configured to add a signal input to the band variable filter circuit and passing therethrough and a signal not being input to the band variable filter circuit and output a resulting signal to the comparator circuit.

(7)

A reception method including:
amplifying an input analog signal with a gain controlled by a predetermined control signal by a variable gain amplifier circuit;

converting the analog signal subjected to gain control output from the variable gain amplifier circuit into a digital signal by an analog-to-digital converter circuit having a predetermined frequency characteristic;

outputting a signal according to a result of comparison between a level of a signal input to the analog-to-digital converter circuit and a predetermined threshold by an overload detector circuit having the same frequency characteristic as that of the analog-to-digital converter circuit; and selecting a signal that lowers the gain of the variable gain amplifier circuit more greatly out of the signal output from the overload detector circuit and another signal, and outputting the control signal to control the gain of the variable gain amplifier circuit on the basis of the selected signal by a selector circuit.

Although embodiments of the present disclosure have been described above, the present disclosure is not limited to the embodiments described above but it should be appreciated that various modifications and applications may occur without departing from the scope of the appended claims.

For example, the embodiments described above specifically explains the structure of devices and systems in detail for easy understanding of the present disclosure, but the embodiments should not be necessarily limited to those including all the components described above. In addition, some components in an example can be replaced by components in another example, and furthermore, a structure of an example may additionally include some components of another example. Still further, some components can be added to, be removed from or substitute for some components in each example.

Some or the whole of the structures, functions, processing units and the like described above may be implemented by hardware by way of designing with integrated circuits, for example. Alternatively, the structures and functions described above may be implemented by software making a processor to interpret and execute programs for implementing the respective functions/Information such as programs, tables, files and the like for implementing the functions can be held in a memory, a hard disk, a volatile or nonvolatile storage such as an SSD (solid state drive), or a recording medium such as an IC card or an optical disk.

Furthermore, control lines and information lines that are considered to be required for explanation are shown, but not all the control lines and information lines of products are necessarily shown. Almost all components may be considered to be mutually connected in practice.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-187410 filed in the Japan Patent Office on Aug. 28, 2012, the entire content of which is hereby incorporated by reference.

REFERENCE SIGNS LIST

3 Variable gain amplifier circuit
5 Frequency converter circuit
6 Analog-to-digital converter circuit
9 Selector circuit
20 Reception device
21, 21A, 21B, 21C, 21D Overload detector circuit
22 Demodulator circuit
31 Filter circuit
32 Comparator circuit
33 Peak hold circuit
51, 52, 53 Frequency characteristic
61, 63 Variable gain amplifier circuit
62 Band variable filter circuit
64 Adder
81, 82 Comparator circuit
83 OR circuit (OR gate)
91 Filter circuit

The invention claimed is:

1. A reception device comprising:
   a variable gain amplifier circuit configured to amplify an input analog signal with a gain controlled by a predetermined control signal;
   an analog-to-digital converter circuit having a predetermined frequency characteristic and configured to convert the analog signal subjected to gain control output from the variable gain amplifier circuit into a digital signal;
   an overload detector circuit having the same frequency characteristic as that of the analog-to-digital converter circuit and configured to output a signal according to a result of comparison between a level of a signal input to the analog-to-digital converter circuit and a predetermined threshold; and
   a selector circuit configured to select a signal that lowers the gain of the variable gain amplifier circuit more greatly out of the signal output from the overload detector circuit and another signal, and output the control signal to control the gain of the variable gain amplifier circuit on the basis of the selected signal.

2. The reception device according to claim 1, wherein the overload detector circuit includes:
   a filter circuit having the same frequency characteristic as that of the analog-to-digital converter circuit;
   a comparator circuit configured to output a signal according to a result of comparison between a level of a signal output from the filter circuit and a predetermined threshold; and
   a peak hold circuit configured to hold a peak value of the output signal.

3. The reception device according to claim 2, wherein the analog-to-digital converter circuit is a $\Delta\Sigma$ analog-to-digital converter circuit with a gain having a low-pass or high-pass frequency characteristic.

4. The reception device according to claim 1, further comprising a frequency converter circuit provided between the variable gain amplifier circuit and the analog-to-digital converter circuit and configured to convert frequency of the analog signal subjected to the gain control to a desired frequency.

5. The reception device according to claim 1, further comprising a demodulator circuit configured to output a control signal to the variable gain amplifier circuit on the basis of a digital signal output from the analog-to-digital converter circuit.

6. The reception device according to claim 2, further comprising as the filter circuit:
   a band variable filter circuit capable of setting a passband corresponding to a passband in the frequency characteristic of the analog-to-digital converter circuit; and
   an adder configured to add a signal input to the band variable filter circuit and passing therethrough and a signal not being input to the band variable filter circuit and output a resulting signal to the comparator circuit.

7. A reception method comprising:

amplifying an input analog signal with a gain controlled by a predetermined control signal by a variable gain amplifier circuit;

converting the analog signal subjected to gain control output from the variable gain amplifier circuit into a digital signal by an analog-to-digital converter circuit having a predetermined frequency characteristic;

outputting a signal according to a result of comparison between a level of a signal input to the analog-to-digital converter circuit and a predetermined threshold by an overload detector circuit having the same frequency characteristic as that of the analog-to-digital converter circuit; and selecting a signal that lowers the gain of the variable gain amplifier circuit more greatly out of the signal output from the overload detector circuit and another signal, and outputting the control signal to control the gain of the variable gain amplifier circuit on the basis of the selected signal by a selector circuit.

* * * * *